(12) United States Patent
Zah

(10) Patent No.: US 6,434,175 B1
(45) Date of Patent: *Aug. 13, 2002

(54) MULTIWAVELENGTH DISTRIBUTED BRAGG REFLECTOR PHASED ARRAY LASER

(75) Inventor: Chung-en Zah, Holmdel, NJ (US)

(73) Assignee: Corning Incorporated, Corning, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/386,544

(22) Filed: Aug. 31, 1999

(51) Int. Cl.[7] .............................................. H01S 3/10
(52) U.S. Cl. .............................. 372/20; 372/92; 372/96
(58) Field of Search ............................. 372/20, 92, 96, 372/108

(56) References Cited

U.S. PATENT DOCUMENTS

| 5,398,130 A | | 3/1995 | Redman | |
|---|---|---|---|---|
| 5,612,968 A | | 3/1997 | Zah | |
| 5,675,592 A | | 10/1997 | Dragone et al. | |
| 5,748,811 A | * | 5/1998 | Amersfoort et al. | 385/15 |
| 5,870,512 A | | 2/1999 | Koch et al. | 385/14 |
| 5,913,000 A | | 6/1999 | Doerr et al. | |

FOREIGN PATENT DOCUMENTS

WO    WO 98/32196    7/1998

OTHER PUBLICATIONS

C.H. Joyner et al. "An 8–Channel Digitally Tunable Transmitter with Electroabsorption Modulated Output by Selective–Area Epitaxy" IEEE Photonics Tech. Lett., vol. 7, No. 9, Sep. 1995 pp. 1013–1015.

F. Hieronymi et al. "High–Performance Large–Area InGaAs Metal–Semiconductor–Metal Photodetectors" IEEE Photonics Tech. Lett., vol. 5, No. 8, Aug. 3 p. 910.

M.G. Young et al. "A 16×1 Wavelength Division Multiplexer with Integrated Distributed Bragg Reflector Lasers and Electroabsorption Modulators" IEEE Photonics Tech. Lett., vol. 5, No. 8, Aug. 1993 pp. 908–910.

M. Zirngibl et al. "An 18–Channel Multifrequency Laser" IEEE Photonics Tech. Lett., vol. 8, No. 7, Jul. 1996 pp. 870–872.

H. Kogelnik et al. "Coupled–Wave Theory of Distributed Feedback Lasers" J. Appl. Phys., vol. 43, No. 5, May 1972 pp. 2327–2335.

C.R. Doerr et al. "Elimination of Signal Distortion and Crosstalk from Carrier Density Changes in the Shared Semiconductor Amplifieer of Multifrequency Signal Sources" IEEE Photonics Tech. Lett., vol. 7, No. 10, Oct. 1995 pp. 1131–1133.

C.R. Doerr et al. "Double–Chirping of the Waveguide Grating Router" IEEE Photonics Tech. Lett., vol. 9, No. 6 Jun. 1997 pp. 776–778.

Leos '95 IEEE Lasers and Electro–Optics Society—D.T.K. Tong et al. "A Novel Optically Controlled Phased Array Antenna System Using a Programmable–Dispersion Fiber and a Mode–locked Laser" pp. 277–278.

(List continued on next page.)

Primary Examiner—Paul Ip
Assistant Examiner—Cornelius H. Jackson
(74) Attorney, Agent, or Firm—Juliana Agon

(57) ABSTRACT

A multiwavelength laser includes a phasar portion (2) for providing wavelength accuracy and a DBR portion (14) coupled to the phasar portion (2) for forming a laser cavity (142) with the phasar portion (2).

20 Claims, 10 Drawing Sheets

OTHER PUBLICATIONS

C. Zah et al. "Multiwavelength DFB Laser Arrays with Integrated Combiner and Optical Amplifier for WDM Optical Networks" IEEE J. Selected Topics in Quantum Elect., vol. 3, No. 2 Apr. 1997 pp. 584–597.

OFC '96 Tech. Digest—M.R. Amersfoort et al. "Polarization–independent InP–arrayed waveguide filter using square cross–section waveguides" pp. 101–102.

M.K. Smit et al. "Phasar–Based WDM–Devices: Principles, Design and Applications" IEEE J. Selected Topics in Quantum Elect., vol. 2, Jun. 1996 pp. 236–250.

S. Menezo et al. "10–Wavelength 200–GHz Channel Spacing Emitter Integrating DBR Lasers with a Phasar on InP for WDM Applications" IEEE Photonics Tech. Lett., vol. 11, No. 7, Jul. 1999 PP. 785–787.

M. Yamaguchi et al. "Semiconductor Photonic Integrated Circuit for High–Density WDM Light Source" Conf. Digest $12^{TH}$—IEEE Int'l Semiconductor Laser Conf. (1990) pp. 160–161.

C.E. Zah et al. "Wavelength Accuracy and Output Power of Multiwavelength DFB Laser Arrays with Integrated Star Couplers and Optical Amplifiers" IEEE Photonics Tech. Lett., vol. 8, No. 7 Jul. 1996 pp. 864–866.

C.A. Brackett et al. "A Scalable Multiwavelength Multihop Optical Network: A Proposal for Research on All–Optical Networks" J of Lightwave Technology, vol. 11, No. 5/6 May/Jun. 1996 pp. 736–752.

M.R. Amersfoort et al. "Performance Study of a 10–wavelength DFB Laser Array with Integrated Electroabsorption Modulators" Proc. of IEEE Lasers and Electro–Optics Society Annual Meeting Th12 (11/96) pp. 1–2.

* cited by examiner

FIG.10

| Features | DFB/DBR laser arrays | phasar lasers | phasar/DBR lasers* |
|---|---|---|---|
| Wavelength accuracy | −<br>±0.2 nm | +<br>±0.02 nm | +<br>±0.02−0.05 nm |
| Number of wavelengths | +<br>8-21 | +<br>8-18 | +<br>8-18 |
| Wavelength mode stability | +<br>Extremely stable | +/−<br>possible mode jump under direct modulation | +/−<br>possible mode jump under direct modulation |
| Wavelength-selectable configuration with a single modulator | +<br>yes | +/−<br>yes<br>(low output power or big chip) | +<br>yes |
| Threshold current | +<br>10-30 mA | −<br>30-60 mA | −<br>30-60 mA |
| Output power per wavelength | +/−<br>-13 dBm<br>0.5 dBm with shared SOA | +/−<br>-13 to -7 dBm<br>0 dBm with shared SOA | +/−<br>-13 to -7 dBm<br>0 dBm with shared SOA |
| Direct modulation | +<br>2.5-10 Gb/s | −<br>155-622 Mb/s | −<br>155-622 Mb/s |
| Integrated external modulator for each wavelength | +<br>yes<br>Low chirp, 2.5-10 Gb/s | −<br>no | +<br>yes<br>Low chirp, 2.5-10 Gb/s |

(+) advantage and (−) disadvantage.
* Estimated values for phasar/DBR lasers

MULTIWAVELENGTH DISTRIBUTED BRAGG REFLECTOR PHASED ARRAY LASER

BACKGROUND OF THE INVENTION

1. Field of the Invention

The present invention relates generally to lasers, and particularly to a distributed Bragg reflector (DBR) laser for use as a transmitter in optical communications.

2. Technical Background

For a wavelength-division-multiplexed (WDM) optical network, the number of independent channels simultaneously transmitted over one physical fiber equals the number of discrete wavelengths transmitted. These channels allow system integrators to explore high information throughput, flexible bandwidth management, optical transparency and optical add/drop switching in a cost effective manner.

In a telecommunication DWDM system application, the transmitter wavelength has to be locked to one of the International Telephone Union (ITU) standard wavelengths of an ITU grid to meet crosstalk specification and ensure reliable operation of the system over its normal operating lifetime (about 25 years). For a multiwavelength optically controlled phased array (phasar) antenna application for use in a dense wavelength division multiplexing (DWDM) system, the number of antenna array elements is equal to the number of wavelengths.

It is highly desirable to have an integrated multiwavelength laser with high wavelength accuracy to support the above DWDM application. Such a laser has to satisfy the following criteria: a stable wavelength comb pre-determined by fabrication; a simplified optical packaging; component sharing (such as a common temperature cooler and optical isolator); simplified testing; and compactness. The above merits should reduce the per-wavelength transmitter cost in both initial procurement and subsequent operation. As is known, a lasing wavelength comb refers to a laser array having a number N of lasers whose output wavelengths are separated by a channel separation or wavelength spacing.

The number of channels available on a single laser chip is limited by the material gain bandwidth and wavelength spacing between the channels. In order to take advantage of the flat gain region of silica-based erbium doped fiber amplifiers (EDFAs), the system wavelengths are restricted to 1545 to 1560 nm. For a 40-channel system, the desirable wavelength spacing is 0.4 nm (or 50 GHz for frequency spacing). It is known that the lasing wavelength of a free-running commercial distributed-feedback (DFB) laser, determined by its built-in DFB grating and the refractive index of the semiconductor waveguide, changes with temperature and has to be temperature-controlled. For example, DFB lasers are often used with a temperature cooler and/or an isolator to maintain a fixed wavelength. With one known fixed DFB laser array technology, a wavelength accuracy of ±0.2 nm (25 GHz) within a given on-chip power combiner and a shared output semiconductor optical amplifier (SOA) can be achieved with high yields. The minimum system wavelength spacing that can be supported by this laser array is about 1.6 nm (200 GHz) since the flat top region of a multiplexer/demultiplexer filter response is a fraction of the channel spacing. Especially for ring or long-distance networks where many filter cascades are required, the wavelength spacing must be defined accurately.

Although wavelength accuracy can be significantly improved with the use of wavelength tunable laser arrays such as the DBR laser array, laser arrays with fixed wavelengths are more desirable than wavelength tunable ones from the perspective of simple operation and long-term reliability.

One approach for the realization of multiwavelength lasers is to integrate an array of gain elements with a wavelength multiplexer to form a phased-array (phasar) laser. In such a phasar laser, a multiplexer is placed inside a laser cavity that is defined by a high reflection coated facet on one cleaved edge and an opposed as-cleaved facet.

As is known, a shared gain element is optional. With a low loss multiplexer, 18-wavelength simultaneous continuous wave (CW) operation of a phasar laser has recently been demonstrated in the literature. In this case, the channel spacing of the laser equals to the channel spacing of the wavelength multiplexer. The wavelength spacing of the phasar laser is expected to be extremely uniform since the wavelength spacing fluctuation is in the order of the longitudinal mode spacing (<0.02 nm). With this approach, a 40-channel combiner with 0.4 nm wavelength spacing is achievable. However, direct modulation in excess of 1 Gb/s per channel of the phasar laser has not been achievable due to the length limitation of the long laser cavity.

Long cavity lasers cannot be directly modulated at a high bit rate since the 3-dB modulation bandwidth decreases as the cavity length increases. If the peak frequency is close to one of the harmonic frequencies of the signal, the signal will be distorted. Hence, for high bit rate applications, a long cavity laser needs a high speed external modulator to shift the peak frequency back towards the center of the modulation bandwidth. This external modulator is quite expensive. Hence, there is at least a cost-saving reason to integrate a long cavity laser with an internal modulator for external modulation.

The severe optical crosstalk due to the shared output optical gain element is another drawback, which restricts simultaneous multichannel modulation.

Another phasar approach has been demonstrated in an 8-channel digitally tunable transmitter that has an electroabsorption modulated output formed by selective-area epitaxy. Although such a digitally wavelength selectable phasar laser integrated with one electroabsorption modulator was demonstrated using the second order diffracted light as the output, its output power was low (at approximately −16 dBm). Since this selectable phasar laser requires a small free spectral range and anti-reflection (AR)/high reflection (HR) split coatings and on one facet, this chip is large and its application of split facet coatings is difficult. Hence, there is a desire to provide a laser capable of simultaneous multichannel modulation, in excess of 2.5 Gbits/s per wavelength while providing wavelength accuracy and selectivity, as additional features, without complications, such as split coatings.

SUMMARY OF THE INVENTION

One aspect of the present invention is the combined advantages of a multiwavelength laser formed from a laser cavity defined on a first reflective end by a phased-array multiplexer and on a second reflective end by a broadband mirror.

In another aspect, the present invention includes a distributed-Bragg-reflector as the broadband mirror.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 10 is a chart showing a comparison among prior-art lasers and the inventive phasar/DBR laser.

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
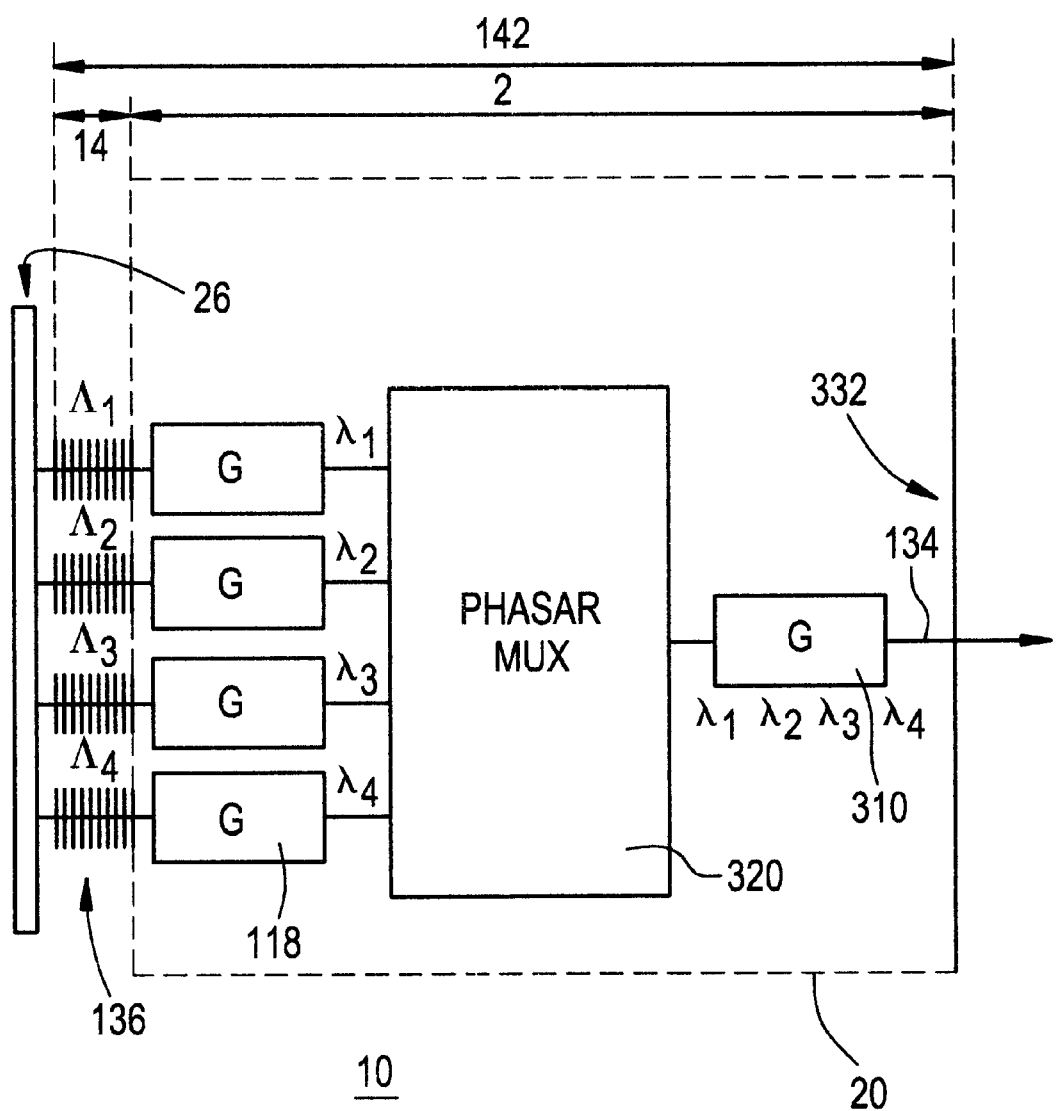
FIG. 1 is a diagrammatic depiction of a multiwavelength phased-array (phasar)/distributed-Bragg-reflector (DBR) laser, in accordance with the present invention.

In accordance with the teachings of the present invention, a new class of multiwavelength lasers called phasar/DBR lasers, as represented by FIG. 1, is shown. An exemplary embodiment of a multiwavelength laser of the present invention is shown in FIG. 1, and is designated generally throughout by reference numeral 10, either in a non-integrated or integrated chip form. In accordance with the invention, the present invention of the multiwavelenth laser 10 includes a phasar portion 2 and a broadband mirror section, such as a DBR portion 14. A cleaved facet 332 disposed in one end of a laser cavity 142 provides a broadband reflection of wavelengths across all channels. A broadband mirror 136, in the DBR portion 14, provides an opposed end of the laser cavity 142 and has a reflection bandwidth less than the channel spacing. A phasar multiplexer, in the phasar portion 2, disposed in the laser cavity 142 in between the cleaved facet 332 and the broadband mirror 136, has a narrow transmission bandwidth less than the reflection bandwidth of the broadband mirror 136 for providing intercavity wavelength filtering. In other words, the phasar multiplexer disposed in the laser cavity and coupled to the cleaved facet, has a free spectral range and a narrow transmission bandwidth for providing intercavity wavelength filtering. The broadband mirror provides an opposed end of the laser cavity and has a reflection bandwidth wider than the narrow transmission bandwidth and narrower than the free spectral range of the phasar multiplexer for providing reflection of a selected wavelength.

This phasar/DBR provides the wavelength accuracy of the phasar laser combined with the ability to integrate an external electroabsorption modulator 410 array (see FIG. 2) such that simultaneous multi-channel modulation in excess of 2.5 Gb/s per wavelength can be realized. Referring to FIG. 1, a phasar multiplexer 320 is located in the middle of a laser cavity 142 formed between each DBR 136 on the left or first reflecting end, and the as-cleaved facet 332, the high-reflection coated facet 132 of FIG. 2, or a second DBR (not shown) on the right or second reflecting end. As long as some form of reflector arrangement with the required reflectivities is present in the cavity, the cavity should operate as described.

The lasing wavelengths from the shared output waveguide 134 are physically determined by which optical gain element 118 is going to be biased on the left, input side or first reflecting end to select a particular wavelength out of a particular comb.

Figure 3:
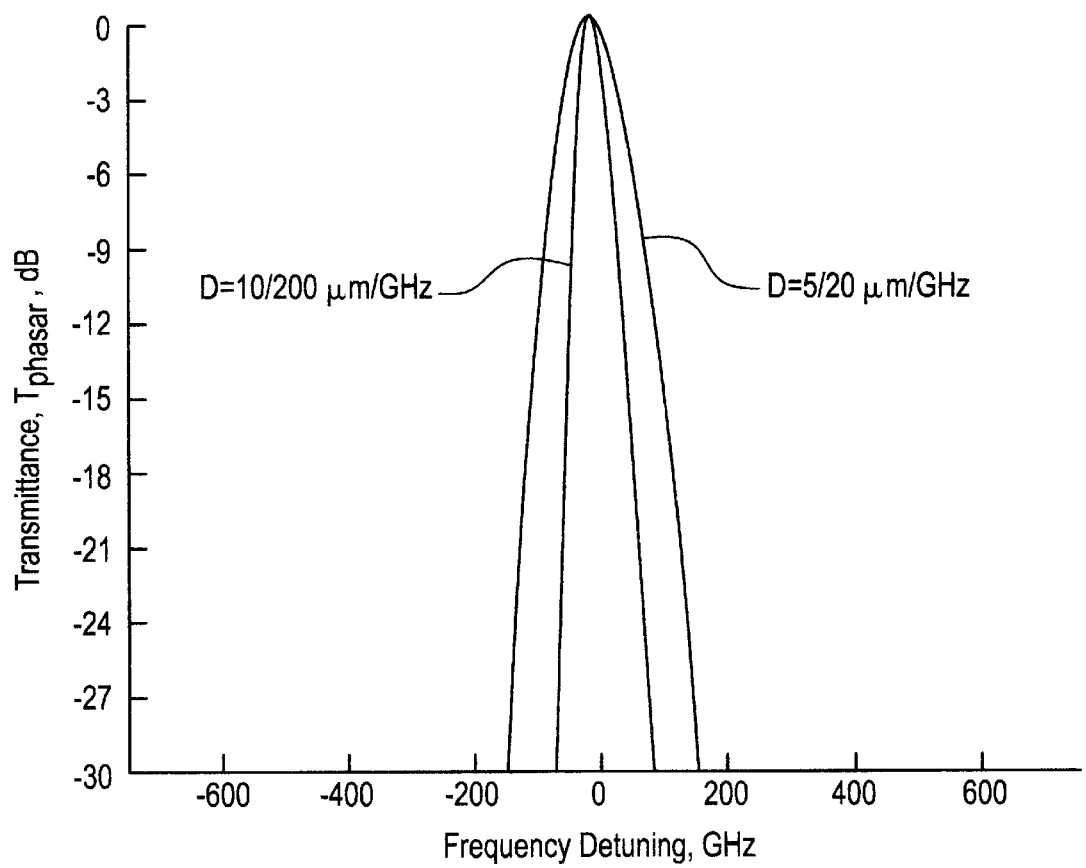
FIG. 3 is a graph of the transmission spectral responses of phasar multiplexers with two different dispersions, 5/200 and 10/200 μm/GHz.

As is known for the phasar multiplexer 320, the free spectral range $f_{FSR}$ and the center wavelength $\lambda_c$ are determined by the following expressions:

$$f_{FSR} = \frac{c/\lambda_c}{m\left(1 - \frac{\lambda}{n_{eff}} \frac{dn_{eff}}{d\lambda}\right)} \quad \text{(eq. 1)}$$

$$\lambda_c = \frac{n_{eff} \Delta L}{m} \quad \text{(eq. 2)}$$

where m is the order of the phasar, $n_{eff}$ is the effective index of the array waveguide mode, and $\Delta L$ is the length difference between adjacent array waveguides. Using Gaussian-beam approximation, the transmission spectral response of a phasar multiplexer in dB scale is approximately given by the following equation:

$$T(\Delta f)_{dB} = -8.69 \left(\frac{D\Delta f}{W_e}\right)^2 \quad \text{(eq. 3)}$$

where $\Delta f$ is the frequency detuning from the center wavelength, $W_e$ is the effective waveguide width of the modal field, and dispersion D is the lateral displacement of the focal spot along the image plane per unit frequency change as given by the following equation:

$$D = \frac{\lambda_c}{n_{slab} f_{FSR} \Delta\alpha} \quad \text{(eq. 4)}$$

where $n_{slab}$ is the effective index of the slab waveguide mode and $\Delta\alpha$ is the divergence angle between the neighboring array waveguides in the fan-in and fan-out sections. FIG. 3 shows the transmission spectral responses of phasar multiplexers with two different dispersions, 5/200 and 10/200 $\mu$m/GHz. The effective waveguide width is assumed to be 2 $\mu$m.

Within a given free spectral range of a phasar multiplexer, each peak transmission wavelength is determined by the dispersion D created by the phased array and the physical location of each input waveguide which is connected to an optical gain element. The channel spacing of the wavelength combiner is extremely uniform because each peak transmission wavelength is globally determined by the same phased array. Any fabrication imperfections, such as material refractive index and layer thickness variations in the phased array will change all peak transmission wavelengths equally such that the channel spacing remains unchanged. If the channel spacing meets the system requirement, the absolute wavelength error can be corrected by adjusting a heat sink temperature.

Figure 4:
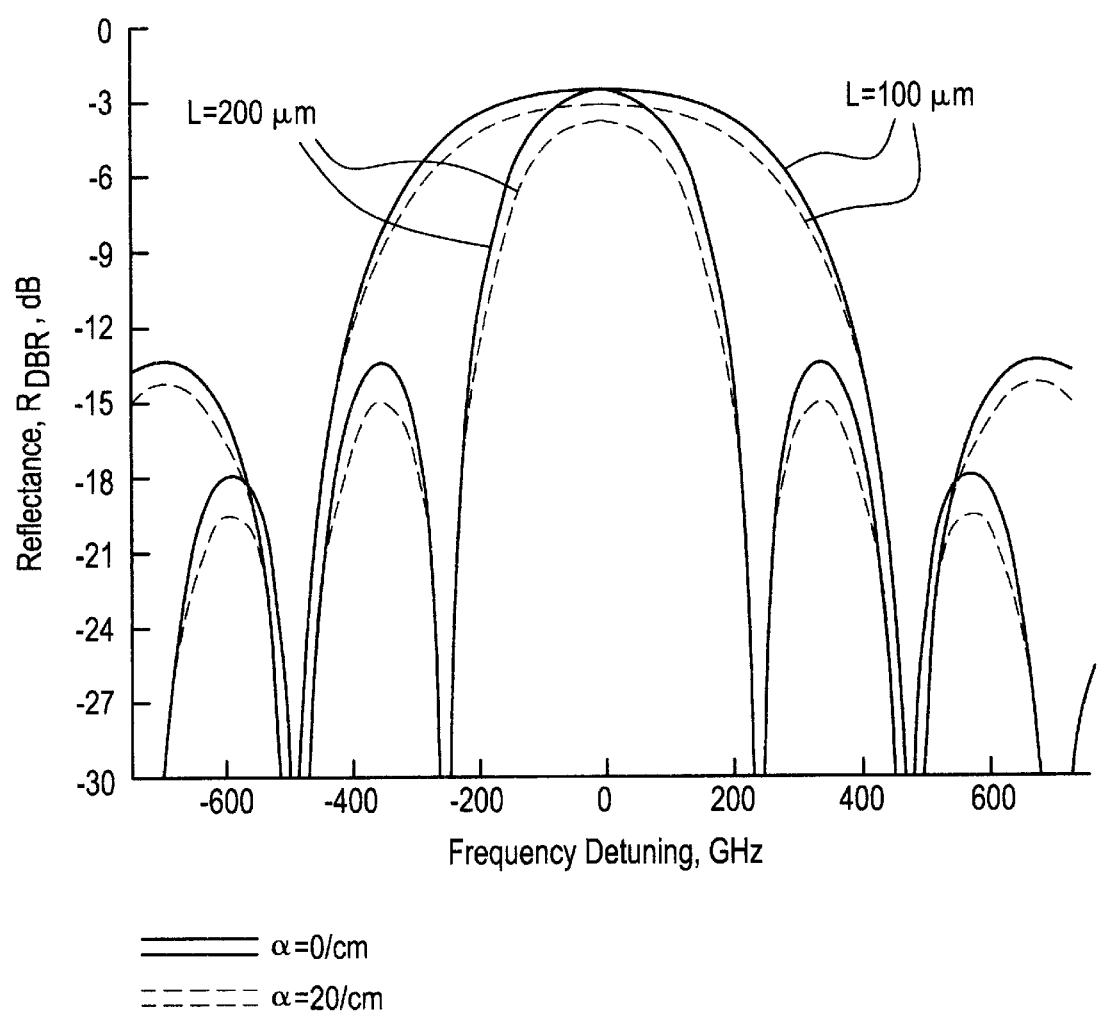
FIG. 4 is a graph of the reflection spectral responses of DBRs with κL=1 and two different lengths, 100 and 200 μm.

As is known for a DBR, the Bragg wavelength $\lambda_B$ and the reflection spectral response $R(\Delta f)$ of a DBR is given by the following equations:

$$\lambda_B = 2n_{eff}\Lambda \quad \text{(eq. 5)}$$

$$R(\Delta f)_{dB} = 20\log\left|\left|\frac{-j\kappa\tanh(\gamma L)}{\gamma + (\alpha/2 + j2\pi n\Delta f/c)\tanh(\gamma L)}\right|\right| \quad \text{(eq. 6)}$$

$$\gamma^2 = (\alpha/2 + j2\pi n\Delta f/c)^2 + \kappa^2 \quad \text{(eq. 7)}$$

where $\Lambda$ is the grating spatial period, L is the grating length, $\alpha$ is the absorption coefficient in the waveguide, and $\kappa$ is the grating coupling coefficient. FIG. 4 shows the reflection spectral responses of DBRs with $\kappa L=1$ and two different grating lengths, 100 and 200 $\mu$m. The waveguide loss is assumed to be zero (solid lines) and 20/cm (dashed lines), respectively. The waveguide loss reduces the reflectance but has very little effect on the reflection bandwidth.

Since each Bragg wavelength is determined by its local effective refractive index and grating period, local variation of the Bragg wavelengths due to fabrication imperfections leads to channel spacing variation within the wavelength combiner which may surpass the system tolerance.

Combining the advantages of the two prior-art structures (phasar and DBR), the lasing wavelength of the phasar/DBR cavity is determined by a minimum average single-trip loss and a round-trip multiple-$\pi$ phase condition, in accordance with the teachings of the present invention. Assuming that the shared facet has no mirror loss, the average single trip loss is given by the following relationship:

$$\text{Loss}(\Delta f)_{dB} = T(\Delta f)_{dB} + R(\Delta f)_{dB}/2$$

Figure 5:
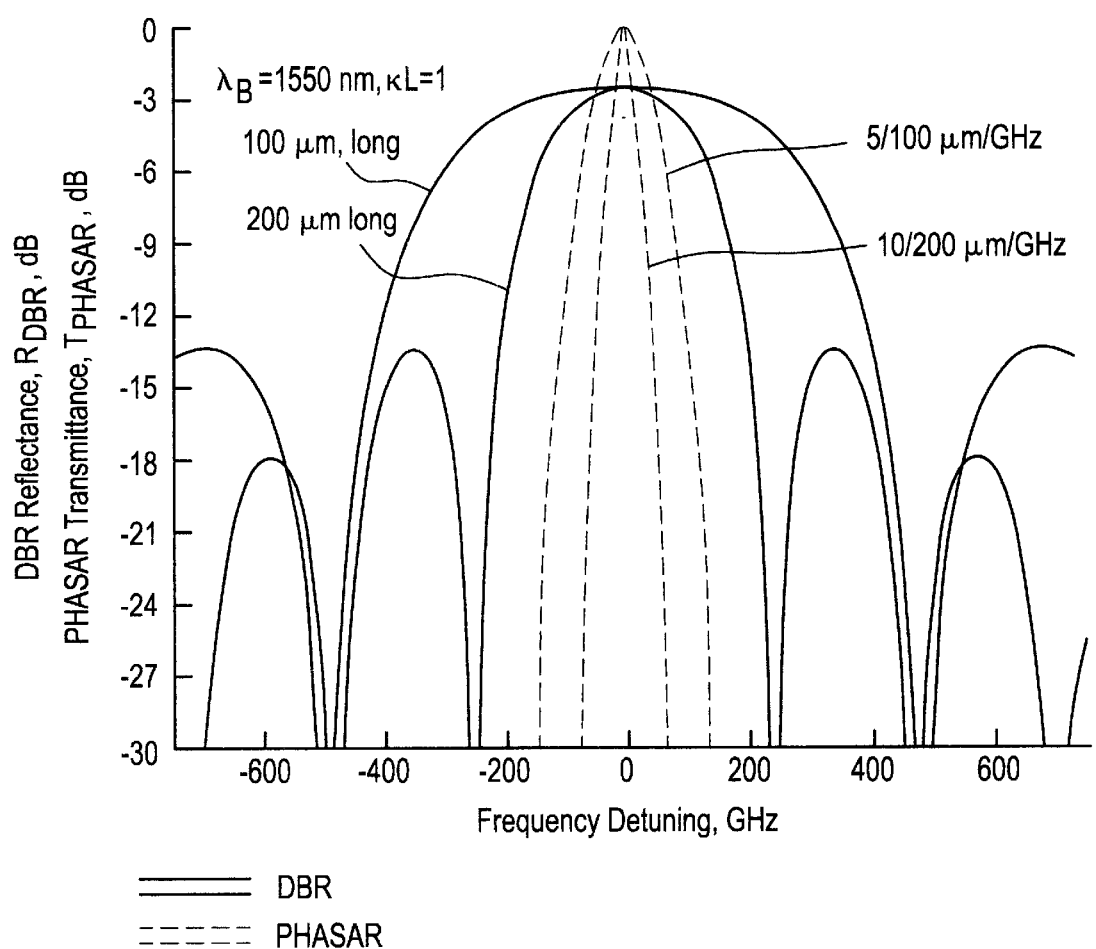
FIG. 5 is a graph of the transmission and reflection spectral responses of the phasar multiplexers (dashed lines) and DBRs (solid lines), respectively.

FIG. 5 shows both transmission and reflection spectral responses of phasar multiplexers (dashed lines) and DBRs (solid lines), respectively. The transmission bandwidth of a typical phasar multiplexer is much smaller than the reflection bandwidth of a typical DBR. Thus the DBR acts as a broadband mirror.

Figure 6:
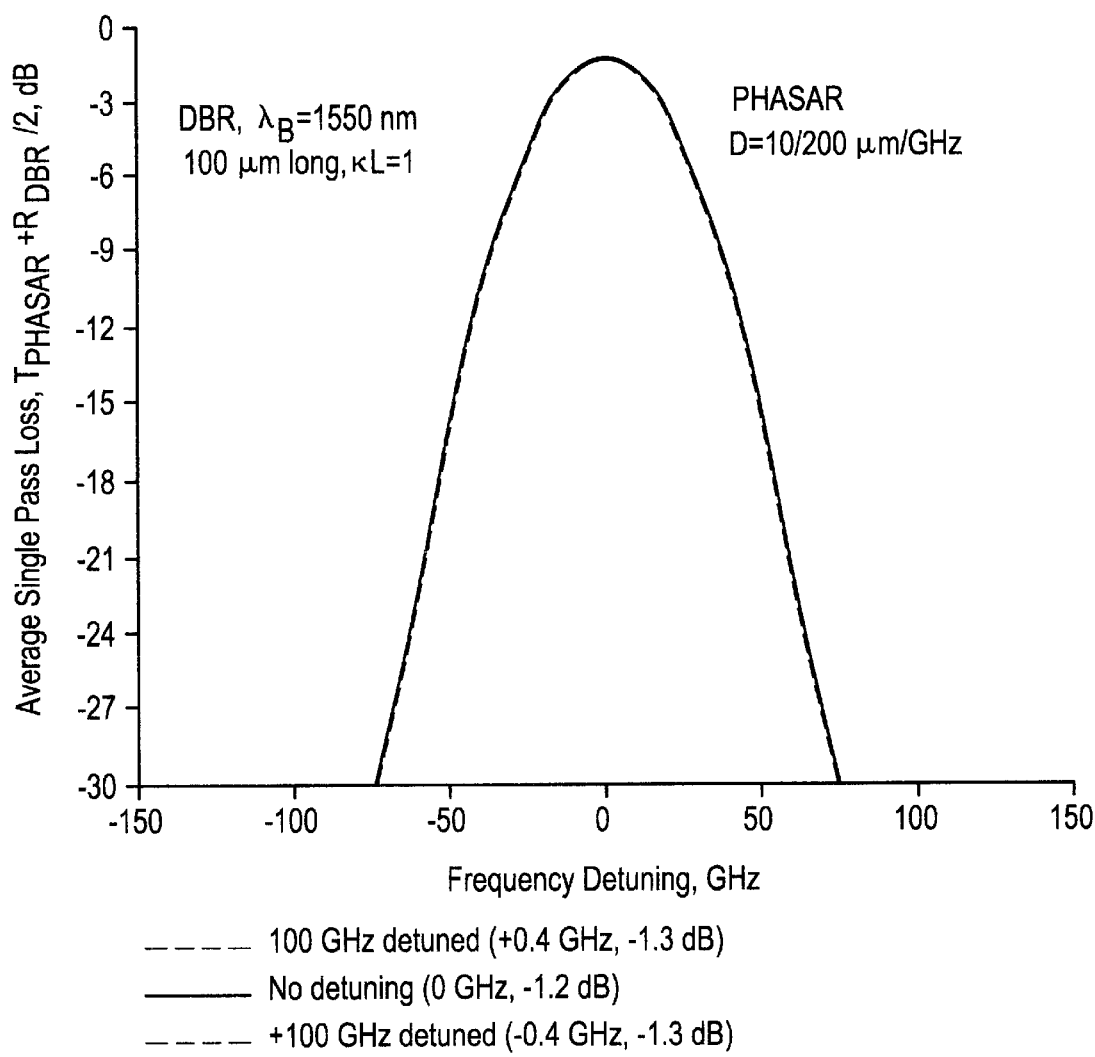
FIG. 6 is a graph of the average single pass loss of the phasar/DBR cavity of FIG. 1 as a function of frequency detuning, assuming L=100 μm for the DBR and a dispersion D=10/200 μm/GHz for the phasar multiplexer.
Figure 7:
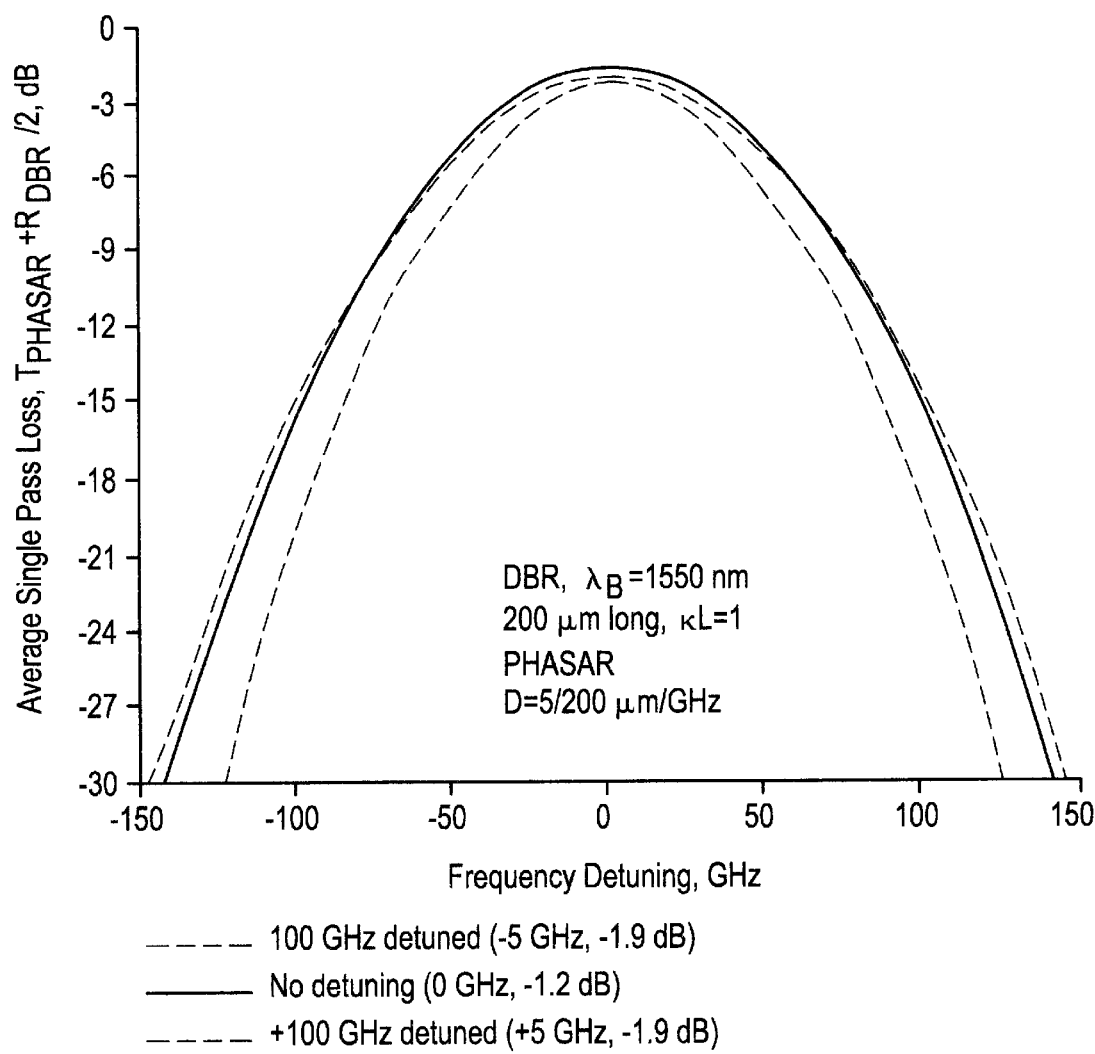
FIG. 7 is a graph of average single pass loss of the phasar/DBR cavity of FIG. 1 as a function of frequency detuning, assuming L=200 μm for the DBR and a dispersion D=5/200 μm/GHz for the phasar multiplexer.

FIG. 6 shows the average single pass loss of a phasar/DBR cavity as a function of frequency detuning, as taught by the present invention. The individual spectral responses are shown in the curves of FIG. 5. Accordingly, $\kappa L=1$ and $L=100$ $\mu$m are assumed for the DBR and $D=10/200$ m/GHz and $W_e=2$ $\mu$m are assumed for the phasar multiplexer. Taking into account fabrication imperfections, the dashed lines in FIG. 6 show the calculated spectral responses when the Bragg wavelength of the DBR is misaligned by ±100 GHz with respect to the peak transmission wavelength of the phasar multiplexer. In this graph, $\kappa L=1$ and $L=100$ $\mu$m are assumed for the DBR and $D=10/200$ m/GHz and $W_e=2$ $\mu$m are assumed for the phasar multiplexer. The solid line represents no frequency detuning between the peak transmission wavelength of the phasar multiplexer and the peak reflection wavelength of the DBR. The dashed lines represent a ±100 GHz frequency detuning. In this detuning case, the minimum loss wavelength is mainly determined by the phasar multiplexer in spite of the ±100 GHz misalignment. Even with less demanding device parameters as shown in the curves of FIG. 5, the minimum loss wavelength is within 5 GHz of the peak transmission wavelength of the phasar as shown in FIG. 7 in spite of the ±100 GHz misalignment. Wavelength detuning will not change with the heat sink temperature since both components have the same temperature dependence resulting from the material refractive index. The facet mirror loss and the excess waveguide loss are not mentioned in this teaching since both are wavelength independent within a wavelength range of 1545 to 1560 nm.

In addition to the minimum loss condition, the lasing wavelength has to satisfy a round trip multiple-$\pi$ phase condition. The lasing wavelength uncertainty due to the phase condition is about ± half of the mode spacing. For a cavity length of 1 cm, the mode spacing is about 4 GHz. Taking into account both loss and phase conditions, the lasing wavelength uncertainty of a phasar/DBR laser should be similar to that of a phasar laser (<±2 GHz) with the best design and <+7 GHz with a less demanding design. Both designs should be able to support a 40-wavelength or 40-channel system with a channel spacing of 50 GHz.

Figure 9:
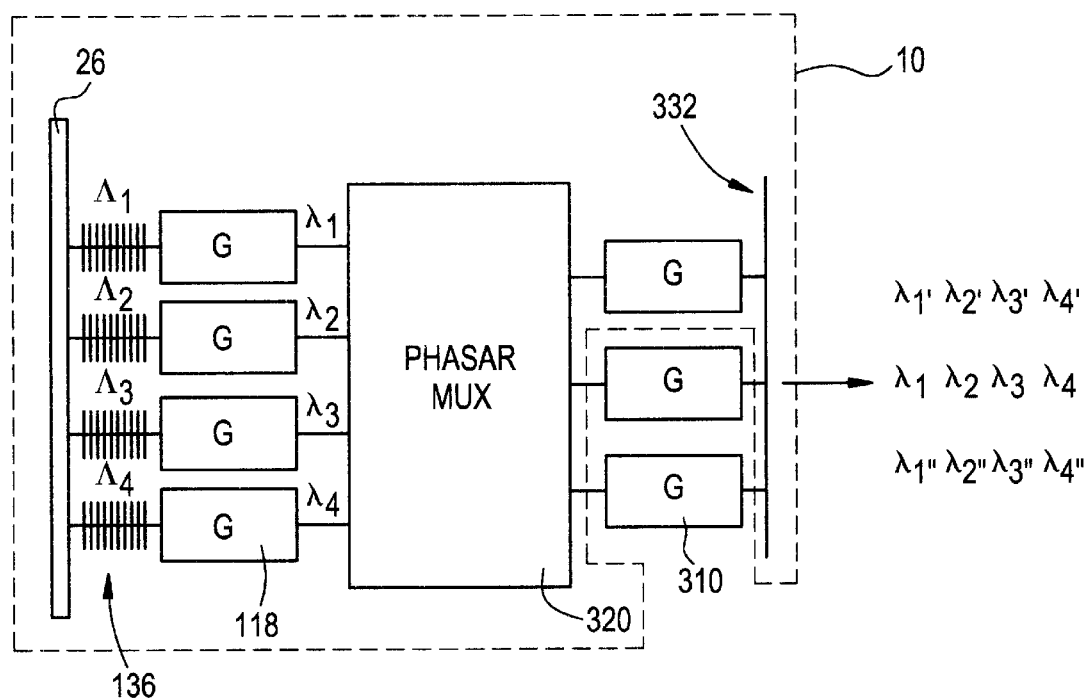
FIG. 9 is a schematic depiction of a phasar/DBR showing wavelength matching of the phasar multiplexer with a plurality of DBRs, in accordance with the present invention.

One way to align the wavelength combiner of the phasar multiplexer with respect to that of the DBRs is shown in FIG. 9. By selecting which shared output optical gain element 310 is to be biased to select which comb, the wavelength comb of the phasar 320 can be discretely tuned such that wavelength detuning is minimized. When unbiased, the unbiased output optical gain elements 310 serve no function since they are optically opaque.

FIG. 10 lists the comparison among several multiwavelength lasers. The inventive phasar/DBR laser has various advantages. Precise wavelength spacing is defined mainly by the phasar multiplexer which can support 40 wavelengths or channels within the flat gain region of the erbium-doped fiber amplifier.

In accordance with the teachings of the present invention, the inventive phasar/DBR avoids the multiband lasing problem of a conventional phasar laser. Since the spectral response of a phasar multiplexer is cyclic, the lasing wavelengths of a phasar might not all come from a given free spectral range due to the very broad bandwidth (~100 nm) of the semiconductor gain element. This condition often leads to a few wavelengths missing from the required system wavelength combiner. Recently, a double-chirped phased array, implemented by a waveguide grating router star coupler with a positive parabolic chirp, has been proposed to reduce the side band transmission. However, the inventive phasar/DBR laser has no such multiband lasing problem since the DBR is not cyclic. Therefore, there is more design freedom in the phasar multiplexer than in conventional phasar lasers.

Figure 2:
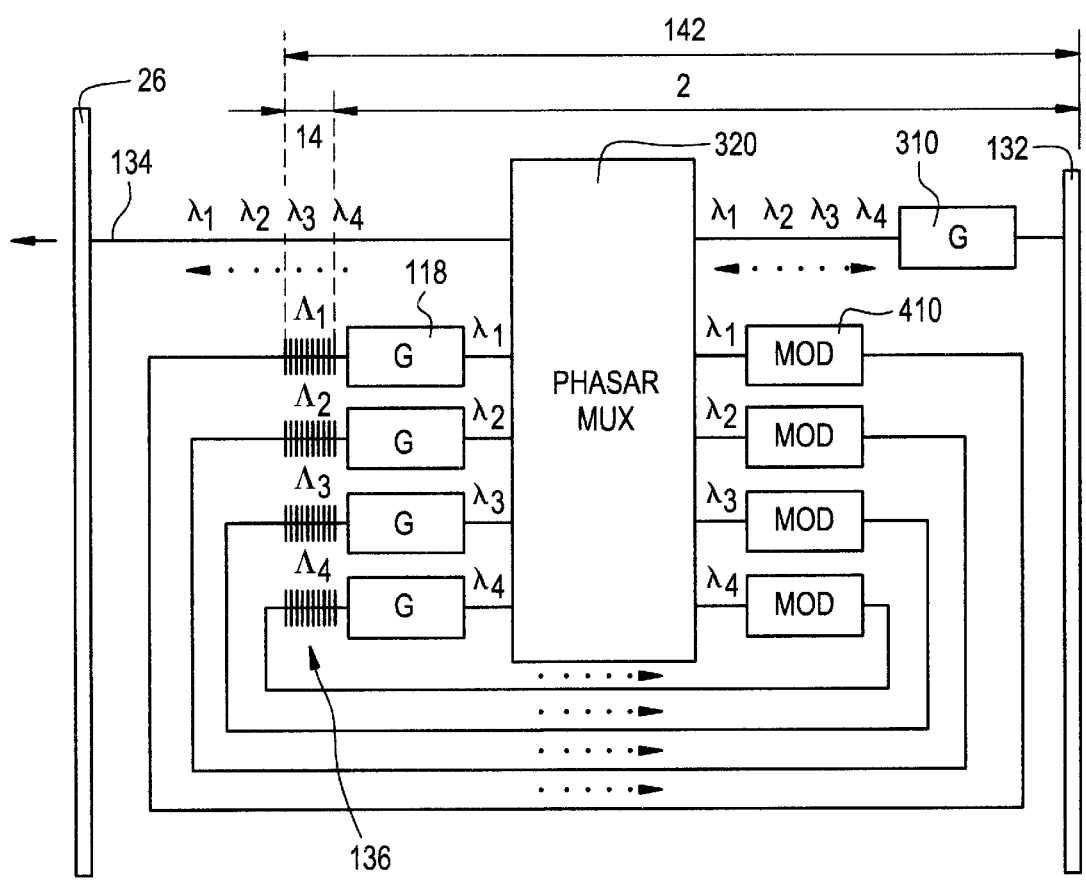
FIG. 2 is a diagrammatic depiction of a multiwavelength phasar/DBR laser with an integrated external modulator array, in accordance with the present invention.

The inventive phasar/DBR also provides the advantage of low chirp and high speed modulation in excess of 2.5 Gb/s per wavelength. An external modulator 410 array can be monolithically integrated outside the phasar/DBR laser cavity 142 as shown in FIG. 2. In this configuration, low chirp and high speed modulation can be obtained in excess of 2.5 Gb/s per wavelength. To simplify the optical pigtaling in one inventive aspect of the invention, the modulated wavelengths are recombined into one output waveguide by the same phasar multiplexer 320 as shown in FIG. 2, thus fully exploiting the multiplexer's unique routing capability. To avoid optical crosstalk due to the back reflection from the facet of the output waveguide 134, a window facet applied with an antireflection facet coating 26 is provided in FIG. 2 and in FIG. 1, instead of the high reflection coated facet of the prior-art phasar laser.

Figure 8:
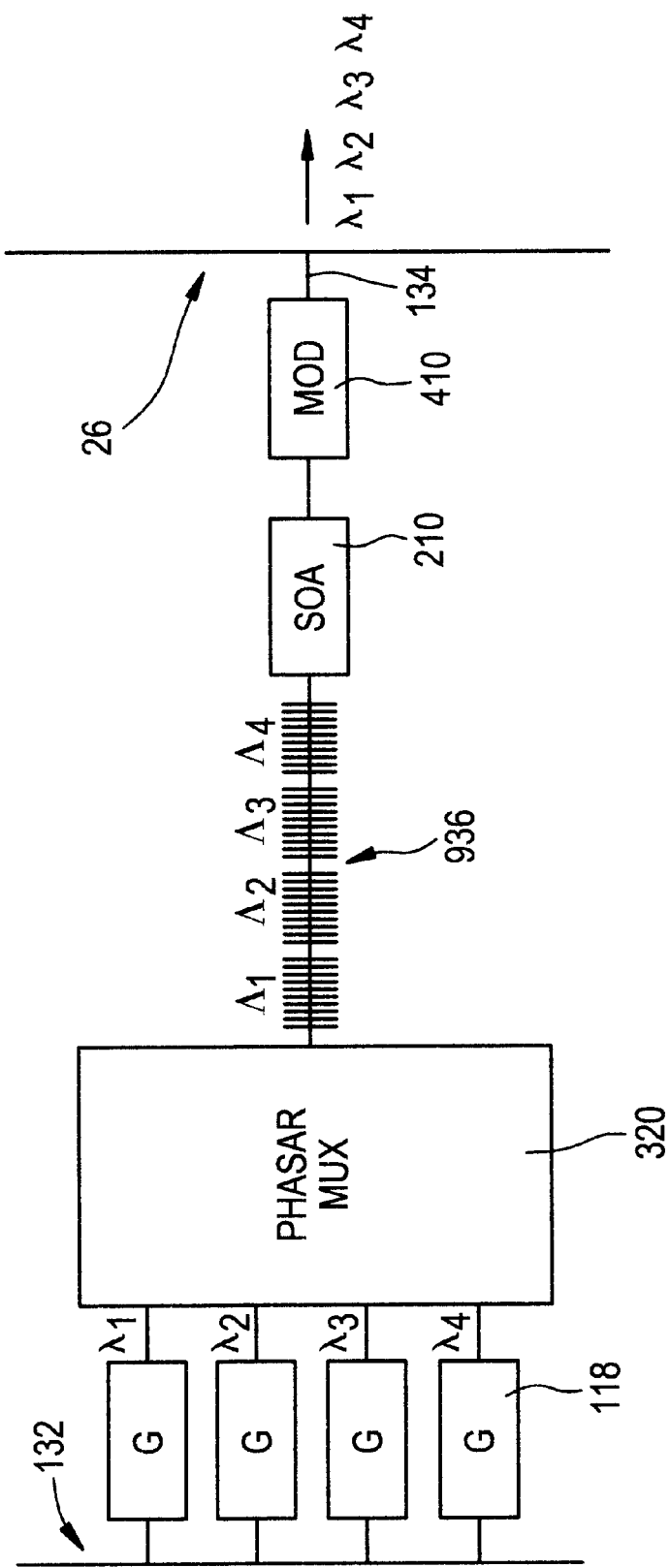
FIG. 8 is a schematic depiction of a wavelength-selectable phasar/DBR laser with an integrated external modulator, in accordance with the present invention.

Wavelength-selectable operation is another advantage that can be implemented as shown in FIG. 8. In this configuration, chirped DBRs 936 are used to produced a broad reflection band covering all the system wavelengths. The lasing wavelength mainly determined by the phasar 320 is selected by which optical gain element 118 is to be biased. The selected wavelength is then modulated by a shared integrated external modulator 410. The output optical amplifier 210 is optional. To avoid optical crosstalk due to the back reflection from the facet of the output waveguide 134, a window facet applied with the antireflection facet coating 26 is used. This inventive wavelength-selectable phasar/DBR laser does not have the low modulation speed drawbacks of a conventional phasar laser. Using the wavelength-selectable laser of FIG. 8 as the backup laser in a WDM network element is an economical way to protect N transmitters where N is the number of wavelengths selectable from one laser chip.

With respect to the integrated phasar/DBR laser chip of FIG. 8, in accordance with the teachings of the present invention, all of the individual elements such as the semiconductor optical amplifier (SOA) 210 integrated with a passive waveguide 134, the phasar demultiplexer 320, the Bragg gratings in the chirped DBRs 936, and the integrated electroabsorption modulator 410 are individually known, but never advantageously combined, and so they will not be described in detail here.

It will be apparent to those of ordinary skill in the pertinent art that modifications and variations can be made to the multiwavelength laser of the present invention depending on the specification of the DBR and phasar combination that is desired, for example, another type of broadband mirror can be substituted for the DBR.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A multiwavelength laser comprising:
    a reflective facet for providing a first reflecting end of a laser cavity;
    a phasar portion disposed in the laser cavity for providing wavelength filtering and coupled to the reflective facet for jointly providing a wavelength selective reflection of a lasing wavelength; and
    a DBR portion coupled to the phasar portion as a feedback mirror to provide a second reflecting end of the laser cavity for sustaining lasing within the laser cavity of the lasing wavelength such that the laser cavity provides a round-trip multiple-$\pi$ phase condition wherein some light of the lasing wavelength has been reflected within the laser cavity multiple times.

2. The multiwavelength laser of claim 1 further comprising:
    an electroabsorption modulator array coupled to the laser cavity such that simultaneous multi-channel modulation greater than 2.5 Gb/s per wavelength is provided.

3. The multiwavelength laser of claim 1 further comprising:
    an integrated external electroabsorption modulator array integrated with the laser cavity such that simultaneous multi-channel modulation greater than 2.5 Gb/s per wavelength is provided.

4. The multiwavelength laser of claim 1 wherein the phasar portion comprises a phasar multiplexer for providing wavelength filtering.

5. The multiwavelength laser of claim 1 wherein the phasar portion comprises a phasar multiplexer disposed in the middle of the laser cavity for providing wavelength filtering.

6. The multiwavelength laser of claim 1 wherein the DBR portion comprises:
    a distributed Bragg reflector forming the first or second reflecting end of the laser cavity for reflecting light back into the laser cavity.

7. The multiwavelength laser of claim 6, wherein the reflective facet comprises a reflective surface for forming the first or second reflecting end of the laser cavity for allowing light to reflect back into the laser cavity.

8. The multiwavelength laser of claim 7, wherein the reflective surface comprises an as-cleaved facet.

9. The multiwavelength laser of claim 7, wherein the reflective surface comprises a second distributed Bragg reflector.

10. The multiwavelength laser of claim 1, wherein the DBR portion comprises a plurality of chirped distributed Bragg reflectors for producing a broad reflection band covering all the system wavelengths of the laser cavity.

11. The multiwavelength laser of claim 1, wherein the phasar portion comprises a gain element coupled to a wavelength comb on an input waveguide for providing the lasing wavelength wherein the physical location of the input waveguide and the dispersion created by the wavelength comb provides a peak transmission wavelength that is related to the lasing wavelength.

12. The multiwavelength laser of claim 7, wherein the reflective facet comprises a high-reflection coated facet.

13. The multiwavelength laser of claim 7 wherein the phasar portion comprises a phasar multiplexer having a wavelength comb characteristic for providing the wavelength filtering and the phasar multiplexer coupled to the reflective surface for jointly providing the wavelength selective reflection of the lasing wavelength.

14. The multiwavelength laser of claim 1, wherein the DBR portion comprises a broadband mirror.

15. A multiwavelength laser having a laser cavity, the laser comprising:
    a cleaved facet disposed in one end of the laser cavity for providing a broadband reflection of wavelengths;
    a phasar multiplexer disposed in the laser cavity coupled to the cleaved facet, the phasar multiplexer having a free spectral range and a narrow transmission bandwidth for providing intercavity wavelength filtering; and a broadband mirror for providing an opposed end of the laser cavity and having a reflection bandwidth wider than the narrow transmission bandwidth and narrower than the free spectral range of the phasar multiplexer for providing reflection of a selected wavelength that has satisfied a round-trip multiple-π phase condition wherein some light of the selected wavelength has been reflected within the laser cavity multiple times.

16. The multiwavelength laser of claim 15 wherein the broadband mirror comprises Bragg gratings.

17. The multiwavelength laser of claim 15 wherein the phasar multiplexer comprises a gain element coupled to a wavelength comb on an input waveguide for selecting the selected wavelength wherein the physical location of the input waveguide and the dispersion created by the wavelength comb provides a peak transmission wavelength that is related to the selected wavelength.

18. An integrated multiwavelength WDM laser transmitter chip having a laser cavity, the chip comprising:

a cleaved facet disposed in one end of the laser cavity for providing a broadband reflection of wavelengths;

a phasar multiplexer disposed in the laser cavity coupled to the cleaved facet, the phasar multiplexer having a free spectral range and a narrow transmission bandwidth for providing intercavity wavelength filtering;

a broadband mirror for providing an opposed end of the laser cavity and having a reflection bandwidth wider than the narrow transmission bandwidth and narrower than the free spectral range of the phasar multiplexer for providing reflection of a selected wavelength that has satisfied a round-trip multiple-π phase condition wherein some light of the selected wavelength has been reflected within the laser cavity multiple times;

an integrated electroabsorption modulator for providing external modulation outside of the laser cavity; and an anti-reflection coated facet for coupling light out-of the laser cavity and for separating the integrated electroabsorption modulator from the laser cavity.

19. The chip of claim 18 further comprising:

a semiconductor optical amplifier (SOA) connected by a passive waveguide for coupling light through the laser cavity and disposed between the broadband mirror and the integrated electroabsorption modulator.

20. The chip of claim 18 further comprising:

at least one tunable gain element disposed in the laser cavity coupled to the phasar multiplexer for selecting a desired lasing wavelength of the laser cavity.

* * * * *